(12) United States Patent
Lim et al.

(10) Patent No.: US 9,559,264 B2
(45) Date of Patent: Jan. 31, 2017

(54) LIGHT EMITTING DEVICE PACKAGE AND LIGHT EMITTING APPARATUS INCLUDING THE PACKAGE

(71) Applicant: LG INNOTEK CO., LTD., Seoul (KR)

(72) Inventors: Woo Sik Lim, Seoul (KR); Jae Won Seo, Seoul (KR); Bum Jin Yim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/922,620

(22) Filed: Oct. 26, 2015

(65) Prior Publication Data

US 2016/0118543 A1    Apr. 28, 2016

(30) Foreign Application Priority Data

Oct. 27, 2014  (KR) ........................ 10-2014-0145830

(51) Int. Cl.
*H01L 33/40* (2010.01)
*H01L 33/42* (2010.01)
(Continued)

(52) U.S. Cl.
CPC ........... *H01L 33/405* (2013.01); *H01L 33/382* (2013.01); *H01L 33/42* (2013.01); *H01L 33/44* (2013.01);
(Continued)

(58) Field of Classification Search
CPC ...... H01L 33/405; H01L 33/46; H01L 33/382; H01L 33/62; H01L 33/42; H01L 33/44
See application file for complete search history.

(56) References Cited

U.S. PATENT DOCUMENTS 9,231,163 B2 * 1/2016 Miyachi ................. H01L 33/06
2012/0074441 A1  3/2012 Seo et al.
2013/0051074 A1  2/2013 Lee et al.

FOREIGN PATENT DOCUMENTS

KR    10-2005-0041536    5/2005
KR    10-2012-00314 72    4/2012
KR    10-2012-0136814    12/2012

OTHER PUBLICATIONS

D. L. Douglass: "The Thermal Expansion of Niobium Pentoxide and its Effect on the Spalling of Niobium Oxidation Films"; Journal of the Less-Common Metals; vol. 5, No. 2; Apr. 1, 1963; pp. 151-157; XP055255143.

(Continued)

*Primary Examiner* — Roy Potter
*Assistant Examiner* — Paul Patton
(74) *Attorney, Agent, or Firm* — KED & Associates, LLP

(57) ABSTRACT

A light emitting device may include a substrate, a light emitting structure disposed under the substrate, the light emitting structure including a first conductive semiconductor layer, an active layer, and a second conductive semiconductor layer, a first electrode configured to penetrate the second conductive semiconductor layer and the active layer, so as to come into contact with the first conductive semiconductor layer, a contact layer configured to come into contact with the second conductive semiconductor layer, a first insulation layer disposed between the second conductive semiconductor layer and the first electrode and between the active layer and the first electrode, the first insulation layer being provided for capping of a side portion and an upper portion of the contact layer, and a second electrode configured to penetrate the first insulation layer, so as to come into contact with the contact layer.

17 Claims, 7 Drawing Sheets

(51) Int. Cl.
*H01L 33/38* (2010.01)
*H01L 33/44* (2010.01)
*H01L 33/46* (2010.01)
*H01L 33/62* (2010.01)

(52) U.S. Cl.
CPC ............... *H01L 33/46* (2013.01); *H01L 33/62* (2013.01); *H01L 2224/16245* (2013.01); *H01L 2924/181* (2013.01)

(56) References Cited

OTHER PUBLICATIONS

European Search Report dated Mar. 17, 2016 issued in Application No. 15189020.9.
Korean Office Action dated Apr. 11, 2016 issued in Application 10-2014-0145830.
Korean Office Action dated Sep. 21, 2016 issued in Application No. 10-2014-0145830.

\* cited by examiner

176

LIGHT EMITTING DEVICE PACKAGE AND LIGHT EMITTING APPARATUS INCLUDING THE PACKAGE

CROSS REFERENCE TO RELATED APPLICATION

This application claims priority under 35 U.S.C. §119 to Korean Patent Application No. 10-2014-0145830, filed in Korea on Oct. 27, 2014, whose entire disclosure is incorporated herein by reference.

TECHNICAL FIELD

Embodiments relate to a light emitting device package and a light emitting apparatus including the package.

BACKGROUND

Light Emitting Diodes (LEDs) are semiconductor devices that convert electricity into light using characteristics of compound semiconductors so as to enable transmission/reception of signals, or that are used as a light source. Group III-V nitride semiconductors are highlighted as core materials of light emitting devices such as, for example, LEDs or Laser Diodes (LDs) due to physical and chemical characteristics thereof.

The LEDs are eco-friendly because they do not include environmentally harmful materials such as mercury (Hg) that are used in conventional lighting devices, e.g., fluorescent lamps and incandescent bulbs. The LEDs also have several advantages, e.g., long lifespan and low power consumption. As such, conventional light sources are being rapidly replaced with LEDs.

Meanwhile, a conventional light emitting device package is configured such that several layers having different coefficients of thermal expansion are stacked one above another. The difference in coefficients of thermal expansion may lead to the destruction of the light emitting device package.

BRIEF DESCRIPTION OF THE DRAWINGS

The embodiments will be described in detail with reference to the following drawings in which like reference numerals refer to like elements wherein.

DETAILED DESCRIPTION

Figure 1:
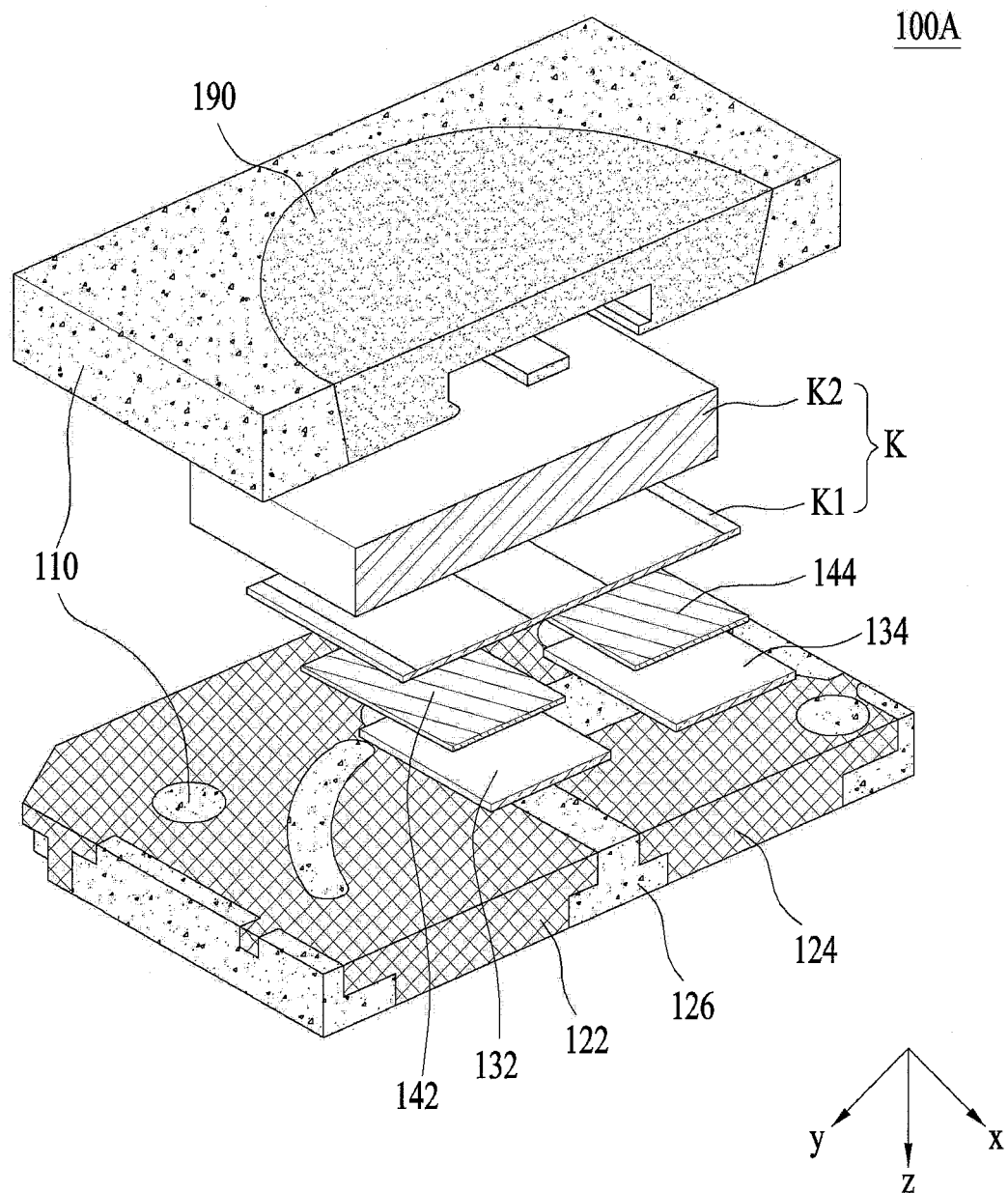
FIG. 1 is a perspective view of a light emitting device package according to an embodiment.
Figure 2:
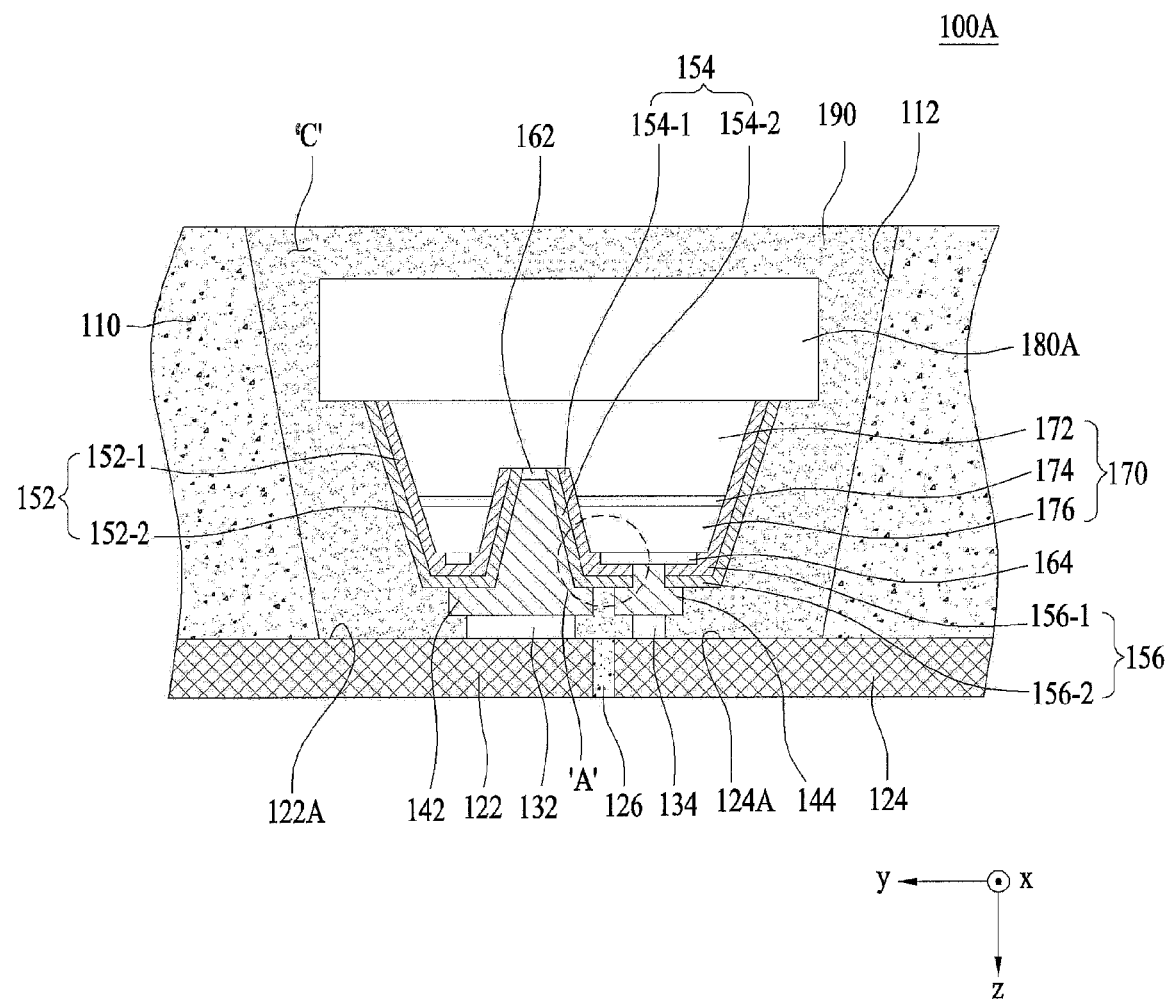
FIG. 2 is a cross sectional view of the light emitting device package illustrated in FIG. 1.

FIG. 1 is a perspective view of a light emitting device package 100A according to an embodiment, and FIG. 2 is a sectional view of the light emitting device package 100A illustrated in FIG. 1. FIG. 2 corresponds to a cross sectional view of the light emitting device package 100A illustrated in FIG. 1, which is taken in the direction of the z-axis and is viewed from the positive direction of the x-axis.

The light emitting device package 100A illustrated in FIG. 1 may include a package body 110, first and second lead frames 122 and 124, an insulator 126, first and second solders 132 and 134, first and second pads 142 and 144, a light emitting device K, and a molding member 190.

The package body 110 may define a cavity C. As exemplarily illustrated in FIGS. 1 and 2, the package body 110 may define the cavity C along with the first and second lead frames 122 and 124. The cavity C may be defined by a side surface 112 of the package body 110 and upper surfaces 122A and 124A of the first and second lead frames 122 and 124. However, the embodiment is not limited thereto. In another embodiment, the cavity C may be defined only by the package body 110, unlike the illustration of FIGS. 1 and 2. Alternatively, a barrier wall may be disposed on the flat upper surface of the package body 110, and the cavity may be defined by the barrier wall and the upper surface of the package body 110. Although the package body 110 may be formed of, for example, an Epoxy Molding Compound (EMC), the embodiment is not limited to the material of the package body 110.

The first and second lead frames 122 and 124 may be spaced apart from each other in the y-axis, which is perpendicular to the thickness direction of a light emitting structure 170. Each of the first and second lead frames 122 and 124 may be formed of a conductive material, for example, a metal, but the embodiment is not limited to the kinds of materials of the first and second lead frames 122 and 124. The insulator 126 may be located between the first and second lead frames 122 and 124 in order to electrically isolate the first and second lead frames 122 and 124 from each other.

In addition, when the package body 110 is formed of a conductive material, for example, a metal material, the first and second lead frames 122 and 124 may constitute a portion of the package body 110. In this case, the first and second lead frames 122 and 124 forming the package body 110 may be electrically isolated from each other by the insulator 126.

The first solder 132 may be located between the first lead frame 122 and the first pad 142 so as to electrically connect the first lead frame 122 and the first pad 142 to each other. The second solder 134 may be located between the second lead frame 124 and the second pad 144 so as to electrically connect the second lead frame 124 and the second pad 144 to each other. Each of the first and second solders 132 and 134 may be solder paste or solder balls.

As described above, the first and second solders 132 and 134 may eliminate the necessity of wires by electrically connecting first and second conductive semiconductor layers 172 and 176 of the light emitting device K to the first and second lead frames 122 and 124, respectively, via the first and second pads 142 and 144. However, according to another embodiment, the first and second conductive semiconductor layers 172 and 176 may be connected, respectively, using wires to the first and second lead frames 122 and 124.

The light emitting device K may be placed inside the cavity C. The light emitting device K may be divided into a lower portion K1 and an upper portion K2. The lower portion K1 of the light emitting device K may include first insulation layers 152, 154 and 156, a first contact layer 162, and a second contact layer 164, and the upper portion K2 of the light emitting device K may include the light emitting structure 170 and a substrate 180A.

The light emitting structure 170 may be disposed under the substrate 180A. The substrate 180A may comprise a conductive material or non-conductive material. For example, the substrate 180A may comprise at least one of sapphire ($Al_2O_3$), GaN, SiC, ZnO, GaP, InP, $Ga_2O_3$, GaAs, or Si, although the embodiment is not limited to the material of the substrate 180A.

In order to improve the difference in Coefficient of Thermal Expansion (CTE) and the lattice mismatch between the substrate 180A and the light emitting structure 170, a buffer layer (or a transition layer) may be further disposed between the two 180A and 170. The buffer layer, for example, may comprise at least one material selected from the group consisting of Al, In, N, and Ga, without being limited thereto. In addition, the buffer layer may have a single layer or multi-layer structure.

The light emitting structure 170 may include a first conductive semiconductor layer 172, an active layer 174, and a second conductive semiconductor layer 176. The light emitting structure 170 may be disposed between the substrate 180A and the first and second lead frames 122 and 124. The first conductive semiconductor layer 172, the active layer 174, and the second conductive semiconductor layer 176 may be stacked one above another in sequence in the direction from the substrate 180A toward the first and second lead frames 122 and 124, i.e., in the positive direction of the +z-axis.

The first conductive semiconductor layer 172 may be implemented by e.g., Group III-V or II-VI compound semiconductors doped with a first conductive dopant. When the first conductive semiconductor layer 172 is an n-type semiconductor layer, the first conductive dopant may be an n-type dopant, and may comprise Si, Ge, Sn, Se, or Te, without being limited thereto.

For example, the first conductive semiconductor layer 172 may be disposed under the substrate 180A and may comprise a semiconductor material having a composition of $Al_xIn_yGa_{(1-x-y)}N$ (0≤x≤1, 0≤y≤1, 0≤x+y≤1). The first conductive semiconductor layer 172 may comprise any one or more materials selected from among GaN, InN, AlN, InGaN, AlGaN, InAlGaN, AlInN, AlGaAs, InGaAs, AlInGaAs, GaP, AlGaP, InGaP, AlInGaP, and InP.

The active layer 174 is disposed between the first conductive semiconductor layer 172 and the second conductive semiconductor layer 176. The active layer 124 is a layer in which electrons (or holes) injected through the first conductive semiconductor layer 172 and holes (or electrons) injected through the second conductive semiconductor layer 176 combine with each other to emit light having energy determined by an inherent energy band of a constituent material of the active layer 174. The active layer 174 may be formed into at least one structure selected from among a single-well structure, a multi-well structure, a single-quantum well structure, a multi-quantum well structure, a quantum dot structure, and a quantum wire structure.

The active layer 174 may include a well layer and a barrier layer having a pair structure of any one or more of InGaN/GaN, InGaN/InGaN, GaN/AlGaN, InAlGaN/GaN, GaAs(InGaAs)/AlGaAs, and GaP(InGaP)/AlGaP, without being limited thereto. The well layer may be formed of a material having lower band gap energy than the band gap energy of the barrier layer.

A conductive clad layer may be formed above and/or under the active layer 174. The conductive clad layer may be formed of semiconductors having higher band gap energy than the band gap energy of the barrier layer of the active layer 174. For example, the conductive clad layer may include GaN, AlGaN, InAlGaN, or a super lattice structure. In addition, the conductive clad layer may be doped with an n-type or p-type dopant.

In some embodiments, the active layer 174 may emit ultraviolet light having a specific wavelength band. The ultraviolet light wavelength band may be within a range from 100 nm to 400 nm. In particular, the active layer 174 may emit light having a wavelength band within a range from 100 nm to 280 nm. However, the embodiment is not limited to the wavelength band of light emitted from the active layer 174.

The second conductive semiconductor layer 176 may be disposed under the active layer 174 and may be formed of a semiconductor compound. The second conductive semiconductor layer 176 may be formed of, for example, Group III-V or II-VI compound semiconductors. For example, the second conductive semiconductor layer 176 may comprise a semiconductor material having a composition of $In_xAl_yGa_{1-x-y}N$ (0≤x≤1, 0≤y≤1, 0≤x+y≤1). The second conductive semiconductor layer 176 may be doped with a second conductive dopant. When the second conductive semiconductor layer 176 is a p-type semiconductor layer, the second conductive dopant may be a p-type dopant and may include, for example, Mg, Zn, Ca, Sr, or Ba.

The first conductive semiconductor layer 172 may be an n-type semiconductor layer, and the second conductive semiconductor layer 176 may be a p-type semiconductor layer. Alternatively, the first conductive semiconductor layer 172 may be a p-type semiconductor layer, and the second conductive semiconductor layer 176 may be an n-type semiconductor layer.

The light emitting structure 170 may be implemented in any one structure selected from among an n-p junction structure, a p-n junction structure, an n-p-n junction structure, and a p-n-p junction structure.

Since the light emitting device package 100A illustrated in FIGS. 1 and 2 has a flip chip bonding structure, light emitted from the active layer 174 may be emitted through the first contact layer 162, the first conductive semiconductor layer 172, and the substrate 180A. Therefore, the first contact layer 162, the first conductive semiconductor layer 172, and the substrate 180A may be formed of a light transmissive material. At this time, although the second conductive semiconductor layer 176 and the second contact layer 164 may be formed of a transmissive or non-transmissive material, or a reflective material, the embodiment may not be limited to a specific material.

The first contact layer 162 may be disposed between the first conductive semiconductor layer 172 and the first pad 142, so as to electrically connect the first conductive semiconductor layer 172 and the first pad 142 to each other. The first contact layer 162 may comprise an ohmic contact material and serve as an ohmic layer. Thus, a separate ohmic layer may be unnecessary, or a separate ohmic layer may be disposed above or under the first contact layer 162.

The second contact layer 164 may be disposed between the second conductive semiconductor layer 176 and the second pad 144, so as to electrically connect the second conductive semiconductor layer 176 and the second pad 144 to each other. As illustrated, the second contact layer 164 may come into contact with the second conductive semiconductor layer 176.

Each of the first and second contact layers 162 and 164 may reflect or transmit light emitted from the active layer 174, rather than absorbing the light, and may be formed of any material that is capable of growing well on the first and second conductive semiconductor layers 172 and 176. For example, each of the first and second contact layers 162 and 164 may be formed of a metal, e.g., Ag, Ni, Al, Rh, Pd, Ir, Ru, Mg, Zn, Pt, Au, Hf, and selective combinations thereof.

Figure 3:
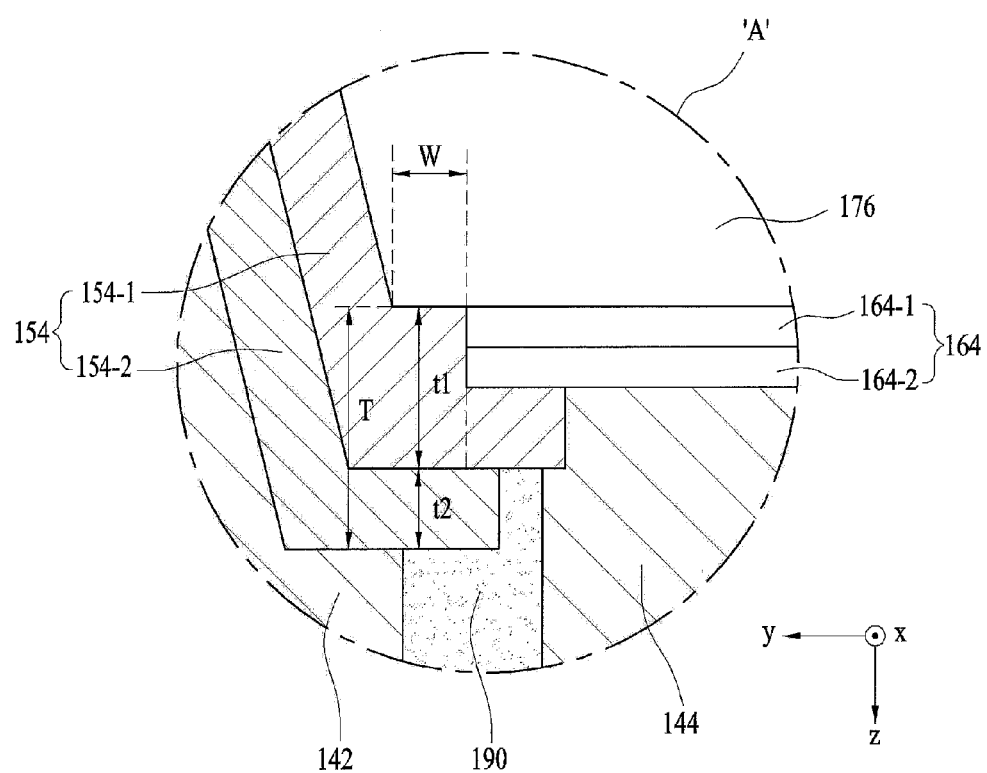
FIG. 3 is an enlarged sectional view of portion 'A' illustrated in FIG. 2.

FIG. 3 is an enlarged sectional view of portion 'A' illustrated in FIG. 2. The second contact layer 164 may comprise a reflective material. For example, the second contact layer 164 may include a transparent electrode 164-1 and a reflective layer 164-2. The reflective layer 164-2 may be formed of a reflective material such as silver (Ag).

The transparent electrode 164-1 may be disposed between the reflective layer 164-2 and the second conductive semiconductor layer 176, and the reflective layer 164-2 may be disposed under the transparent electrode 164-1. The transparent electrode 164-1 may be a Transparent Conductive Oxide (TCO) film. For example, the transparent electrode 164-1 may comprise at least one of Indium Tin Oxide (ITO), Indium Zinc Oxide (IZO), Indium Zinc Tin Oxide (IZTO), Indium Aluminum Zinc Oxide (IAZO), Indium Gallium Zinc Oxide (IGZO), Indium Gallium Tin Oxide (IGTO), Aluminum Zinc Oxide (AZO), Antimony Tin Oxide (ATO), Gallium Zinc Oxide (GZO), IrOx, RuOx, RuOx/ITO, Ni/IrOx/Au, or Ni/IrOx/Au/ITO, and is not limited to these materials.

The second contact layer 164 may have ohmic characteristics and may comprise a material for ohmic contact with the second conductive semiconductor layer 176. When the second contact layer 164 serves as an ohmic layer, a separate ohmic layer may not be necessary.

The first pad 142 may be disposed between the first solder 132 and the first conductive semiconductor layer 172, so as to electrically connect the first solder 132 and the first conductive semiconductor layer 172 to each other. As exemplarily illustrated in FIGS. 1 and 2, although the first pad 142 may be implemented in the form of a penetration electrode that penetrates the second conductive semiconductor layer 176 and the active layer 174 so as to be electrically connected to the first conductive semiconductor layer 172, the embodiment is not limited thereto. The first pad 142 may bypass the second conductive semiconductor layer 176 and the active layer 174 to thereby be electrically connected to the first conductive semiconductor layer 172. As such, the first pad 142 may serve as a first electrode.

The second pad 144 may be disposed between the second solder 134 and the second conductive semiconductor layer 176, so as to electrically connect the second solder 134 and the second conductive semiconductor layer 176 to each other. Although the second pad 144 may be implemented in the form of a penetration electrode that penetrates the first insulation layers 154 and 156 so as to come into contact with the second contact layer 164, the embodiment is not limited thereto. The second pad 144 may be connected to the second contact layer 164 without penetrating the first insulation layers 154 and 156. As such, the second pad 144 may serve as a second electrode. Each of the first and second pads 142 and 144 may comprise an electrode material.

The first insulation layers 152 and 154 may be disposed between the second conductive semiconductor layer 176 and the first pad 142, so as to electrically insulate the second conductive semiconductor layer 176 and the first pad 142 from each other. In addition, the first insulation layers 152 and 154 may be disposed between the active layer 174 and the first pad 142, so as to electrically insulate the active layer 174 and the first pad 142 from each other. At this time, the first insulation layer 152 may be located for the capping of the side portion and the upper portion of the second contact layer 164.

According to the embodiment, each of the first insulation layers 152, 154, and 156 may take the form of a multi-layer structure including at least two layers. As exemplarily illustrated in FIG. 3, the first insulation layer 154 may include two layers such as a first-first insulation layer 154-1 and a first-second insulation layer 154-2.

Alternatively, each of the first insulation layers 152, 154 and 156 may be configured such that multiple layers including at least two layers are repeated. As exemplarily illustrated in FIG. 3, the first insulation layer 154 may be configured such that the first-first insulation layer 154-1 and the first-second insulation layer 154-2 are repeatedly stacked one above another.

The at least two layers constituting each of the first insulation layers 152, 154 and 156 may be formed of materials having different coefficients of thermal expansion (CTE). Referring to FIG. 3, the coefficient of thermal expansion of the first-first insulation layer 154-1 and the coefficient of thermal expansion of the first-second insulation layer 154-2 may differ from each other.

Each of the at least two layers constituting each of the first insulation layers 152, 154 and 156 may comprise at least one of $SiO_2$, $TiO_2$, $ZrO_2$, $Si_3N_4$, $Al_2O_3$, or $MgF_2$. The coefficient of thermal expansion (CTE) of $SiO_2$, $TiO_2$, $ZrO_2$, $Si_3N_4$, $Al_2O_3$, and $MgF_2$ may be respectively, $0.55 \times 10^{-6}$/K, $9 \times 10^{-6}$/K, $8.5 \times 10^{-6}$/K, $2.5 \times 10^{-6}$/K, $7.5 \times 10^{-6}$/K, and 10 to $15 \times 10^{-6}$/K.

When the difference between the average value of the coefficients of cubic (or volumetric) thermal expansion $CTE_{AVE}$ (hereinafter referred to as the "first average value") of the at least two layers constituting each of the first insulation layers 152, 154 and 156 and a first coefficient of thermal expansion of the substrate 180A is less than $\pm 3 \times 10^{-6}$/K or greater than $\pm 9 \times 10^{-6}$/K, there is a likelihood that there is sufficient residual stress to destroy the first insulation layers 152, 154 and 156. While the difference between the first coefficient of thermal expansion of the substrate 180A and the first average value may be within a range from $\pm 3 \times 10^{-6}$/K to $\pm 9 \times 10^{-6}$/K, and for example, $\pm 4 \times 10^{-6}$/K or less, the embodiment is not limited thereto.

Alternatively, when the substrate 180A is formed of sapphire, the difference between the first coefficient of thermal expansion of the substrate 180A and the first average value may be within a range from $\pm 2.5 \times 10^{-6}$/K to $\pm 12.5 \times 10^{-6}$/K, such as, $\pm 5 \times 10^{-6}$/K or less.

Generally, the average value $CTE_{AVE}$ of coefficients of cubic thermal expansion of first and second materials may be represented by the following Equation 1.

$$CTE_{AVG} = \frac{V1}{V1+V2} \times CTE1 + \frac{V2}{V1+V2} \times CTE2 \qquad \text{[Equation 1]}$$

In the above Equation 1, V1 is the volume of the first material, V2 is the volume of the second material, CTE1 is the CTE of the first material, and CTE2 is the CTE of the second material.

While the difference between the first average value and the average value of the coefficient of cubic thermal expansion of the upper portion K2 of the light emitting device K (hereinafter referred to as the "second average value") may be within a range from $\pm 3 \times 10^{-6}$/K to $\pm 9 \times 10^{-6}$/K, such as, $\pm 4 \times 10^{-6}$/K or less, the embodiment is not limited thereto.

When the substrate 180A is formed of sapphire, the light emitting structure 170 is formed of GaN, and the reflective layer of the second contact layer 164 is formed of silver (Ag), the difference between the coefficients of thermal expansion (or average values) between the case where the first insulation layers 152, 154 and 156 are replaced with a single layer (hereinafter referred to as a "Comparative Example") and the case where each of the first insulation layers 152, 154 and 156 has a multilayer structure (hereinafter respectively referred to as a "First Example" and a "Second Example") may be as in the following Table 1.

first layer may include a first dielectric layer such as $TiO_2$, and the second layer may include a second dielectric layer such as $SiO_2$. The DBR may take the form of a stack of at least one pair of $TiO_2/SiO_2$ layers. Each of the first layer and the second layer may have a thickness of $\lambda/4$, and $\lambda$ may be the wavelength of light generated in a light emitting cell.

When the total thickness (e.g., T) of each of the first insulation layers 152, 154 and 156 is less than 0.5 μm, the

TABLE 1

| | | Comparative Example | | First Example | | Second Example | |
|---|---|---|---|---|---|---|---|
| | Classification | CTE | $CTE_{AVG}$ | $CTE(CTE_{AVG})$ | $CTE_{AVG}$ | $CTE(CTE_{AVG})$ | $CTE_{AVG}$ |
| K2 | Substrate (180A) | 7.5 | 7.4 | 7.5 | 7.4 | 7.5 | 7.4 |
| | Light Emitting Structure (170) | 5.6 | | 5.6 | | 5.6 | |
| K1 | Second Contact Layer (164) | 13.4 | 8.9 | 13.4 | 7.2 | 13.4 | 7.8 |
| | First Insulation Layer | 0.55 | | 3.9 | | 5.5 | |
| Pad | | 13.7 | 13.7 | 13.7 | 13.7 | 13.7 | 13.7 |

In the above Table 1, the unit of each of CTE and $CTE_{AVG}$ is $10^{-6}$/K, and the values 3.9 and 5.5 of the first insulation layers 152, 154 and 156 in the First Example and Second Example represent first average values $CTE_{AVG}$.

Referring to Table 1, in the Comparative Example, the difference between the CTE (=$7.5 \times 10^{-6}$/K) of the substrate 180A and the CTE (=$0.55 \times 10^{-6}$/K) of the first insulation layer is greater than $4 \times 10^{-6}$/K, whereas, in the First Example and Second Example, the difference between the CTE (=$7.5 \times 10^{-6}$/K) of the substrate 180A and the first average value $CTE_{AVG}$ (=$3.9 \times 10^{-6}$/K or $5.5 \times 10^{-6}$/K) is $4 \times 10^{-6}$/K or less. In addition, in the Comparative Example, the difference between the second average value $CTE_{AVG}$ (=$7.4 \times 10^{-6}$/K) and the CTE (=$0.55 \times 10^{-6}$/K) of the first insulation layer is greater than $4 \times 10^{-6}$/K, whereas, in the First Example and Second Example, the difference between the second average value $CTE_{AVG}$ (=$7.4 \times 10^{-6}$/K) and the first average value $CTE_{AVG}$ (=$3.9 \times 10^{-6}$/K or $5.5 \times 10^{-6}$/K) is $4 \times 10^{-6}$/K or less.

Referring to Equation 1 and FIG. 3, the first average value may be adjusted by varying the first and second thicknesses t1 and t2 of, for example, the layers 154-1 and 154-2 constituting the first insulation layer 154. This is because the volume of the first-first insulation layer 154-1 and the volume of the first-second insulation layer 154-2 may vary according to the first and second thicknesses t1 and t2, assuming that the sizes of planes parallel to the x-axis and the y-axis are the same as each other.

In addition, the at least two layers constituting each of the first insulation layers 152, 154 and 156 may have different thicknesses. For example, referring to FIG. 3, the first thickness t1 of the first-first insulation layer 154-1 and the second thickness t2 of the first-second insulation layer 154-2 may be different from each other.

As exemplarily illustrated in FIG. 3, although the width W of the first-first insulation layer 154-1 overlapping the top of the second conductive semiconductor layer 176 in the z-axis, i.e. in the vertical direction, may be approximately 3 μm in consideration of a process margin, the embodiment is not limited thereto.

The first insulation layers 152, 154 and 156 may be configured into a Distributed Bragg Reflector (DBR). In this case, the DBR may perform an insulation function and/or may perform a reflection function.

The DBR may be configured in a manner such that a first layer and a second layer, which have different indices of refraction, are alternately stacked one above another at least once. The DBR may be an electrical insulation material. The first insulation layers 152, 154 and 156 may not perform an insulation function. In addition, when the total thickness (e.g., T) of each of the first insulation layers 152, 154 and 156 is greater than 10 μm, this may cause difficulties with regard to manufacturing processes. Accordingly, the total thickness (e.g., T) of each of the first insulation layers 152, 154 and 156 may be within a range from 0.5 μm to 10 μm and, for example, may be within a range from 1 μm to 3 μm.

Figure 4:
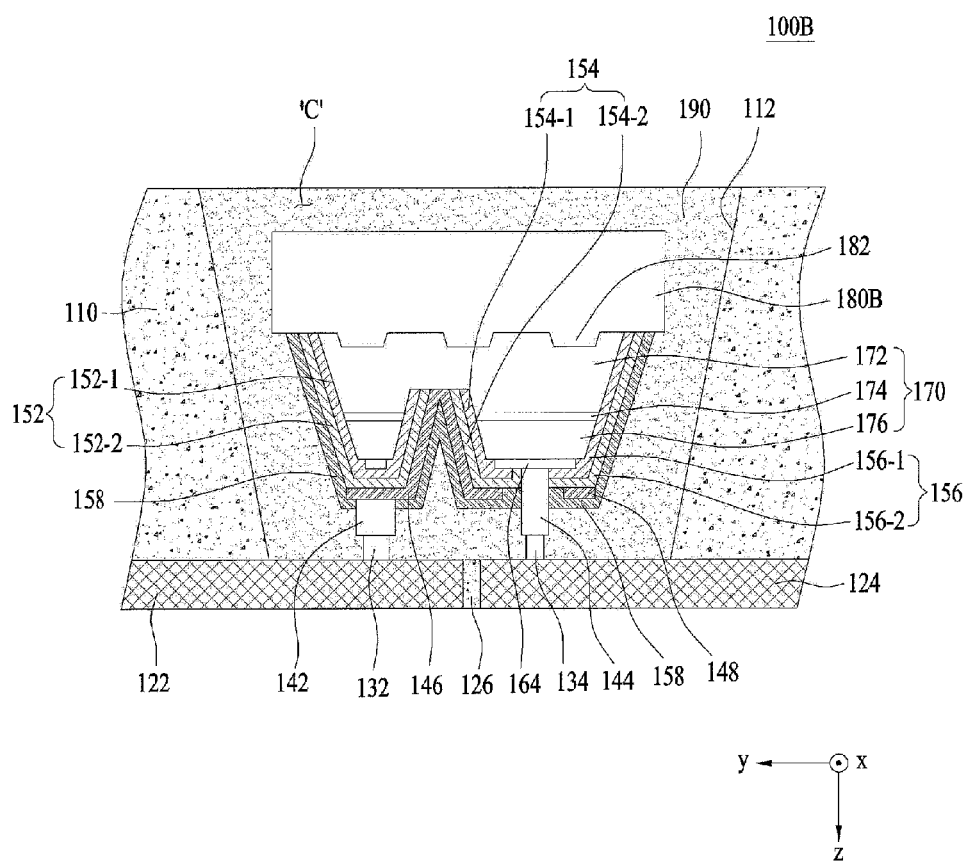
FIG. 4 is a sectional view of a light emitting device package according to another embodiment.
Figure 5:
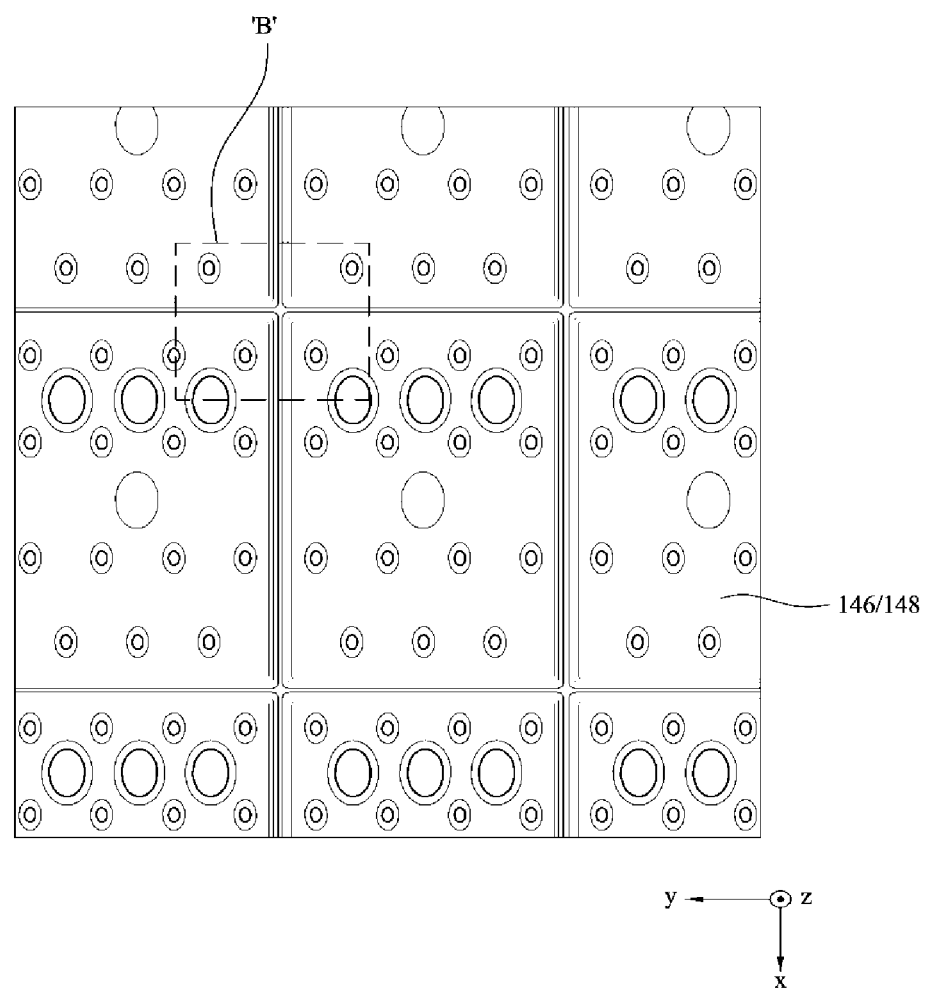
FIG. 5 is a local plan view of the light emitting device package illustrated in FIG. 4.
Figure 6:
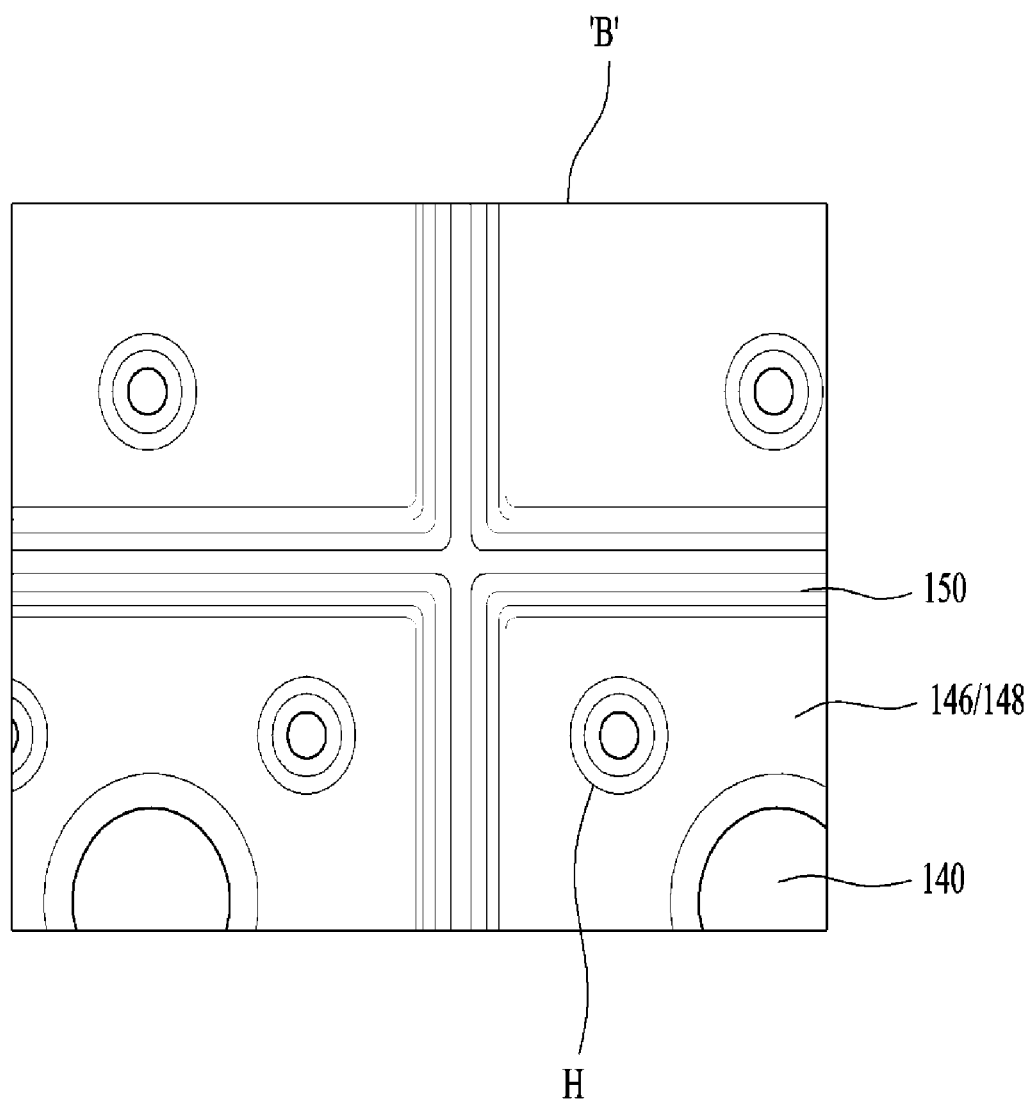
FIG. 6 is an enlarged plan view of portion 'B' illustrated in FIG. 5.

FIG. 4 is a sectional view of a light emitting device package 100B according to another embodiment, and FIG. 5 is a local plan view of the light emitting device package 100B illustrated in FIG. 4. In particular, FIG. 5 is a plan view of the light emitting device package 100B viewed in the +z-axis after deposition of metal layers 146 and 148. FIG. 6 is an enlarged plan view of portion 'B' illustrated in FIG. 5. In FIG. 6, reference numeral 140 designates the first or second pad 142 or 144, reference numeral 150 designates the first insulation layers 152, 154 and 156, and reference character "H" designates the metal layer 146 that penetrates the second conductive semiconductor layer 176, the active layer 174, and a portion of the first conductive semiconductor layer 172.

The first insulation layers 150, 152, 154 and 156, the second contact layer 164, the metal layers 146 and 148, and a second insulation layer 158 may correspond to the lower portion K1 of the light emitting device K illustrated in FIG. 1, and the substrate 180B and the light emitting structure 170 may correspond to the upper portion K2 of the light emitting device K illustrated in FIG. 1. Although the light emitting device package 100B is illustrated as not including the first contact layer 162 illustrated in FIG. 2, in another embodiment, the light emitting device package 100B may include the first contact layer 162 disposed in the shape illustrated in FIG. 2.

For convenience, the bonding pad 142 and the second pad 144 in FIG. 4 are described using the same reference numerals as the first and second pads 142 and 144 illustrated in FIGS. 1 and 2. This is because the bonding pad 142 illustrated in FIG. 4 is the same as the first pad 142 illustrated in FIGS. 1 and 2 except that the bonding pad 142 is electrically connected to the first conductive semiconductor layer 172 via the metal layer 146. This is also because the second pad 144 illustrated in FIG. 4 is the same as the second pad 144 illustrated in FIGS. 1 and 2 except that the second pad 144 penetrates the first insulation layers 154 and 156, the second insulation layer 158 and the metal layers 146 and 148 to thereby be electrically connected to the second contact layer 164.

The light emitting device package 100B illustrated in FIGS. 4 and 5 is the same as the light emitting device package 100A illustrated in FIGS. 1 and 2 except for the above-described differences, and thus has been described using the same reference numerals so that a repeated description of the same configurations is omitted.

Unlike the light emitting device package 100A illustrated in FIG. 2, a first electrode of the light emitting device package 100B illustrated in FIG. 4 may include the metal layers 146 and 148 and the bonding pad 142. The metal layer 146 may penetrate the second conductive semiconductor layer 176, the active layer 174, and a portion of the first conductive semiconductor layer 172, so as to be electrically connected to the first conductive semiconductor layer 172. The metal layers 146 and 148 may be electrically isolated from the second conductive semiconductor layer 176 and the active layer 174 by the first insulation layers 152, 154 and 156.

The light emitting device package 100B illustrated in FIG. 4 may further include the second insulation layer 158. The second insulation layer 158 may be disposed to enclose the first insulation layers 152, 154 and 156 and the metal layer 146. In this case, the bonding pad 142 may penetrate the second insulation layer 158 to thereby be electrically connected to or electrically come into contact with the metal layer 146, and the second pad 144 corresponding to a second electrode may penetrate the first and second insulation layers 154, 156 and 158 and the metal layers 146 and 148 to thereby be electrically connected to or electrically come into contact with the second contact layer 164.

The substrate 180B illustrated in FIG. 4 may include a pattern 182 unlike the substrate 180A illustrated in FIG. 2. The pattern 182 may have various cross-sectional shapes so as to assist light emitted from the active layer 174 in escaping from the light emitting device package 100B. For example, the substrate 180B may be a Patterned Sapphire Substrate (PSS). The substrate 180A illustrated in FIG. 2 may also have the pattern 182.

Figure 7:
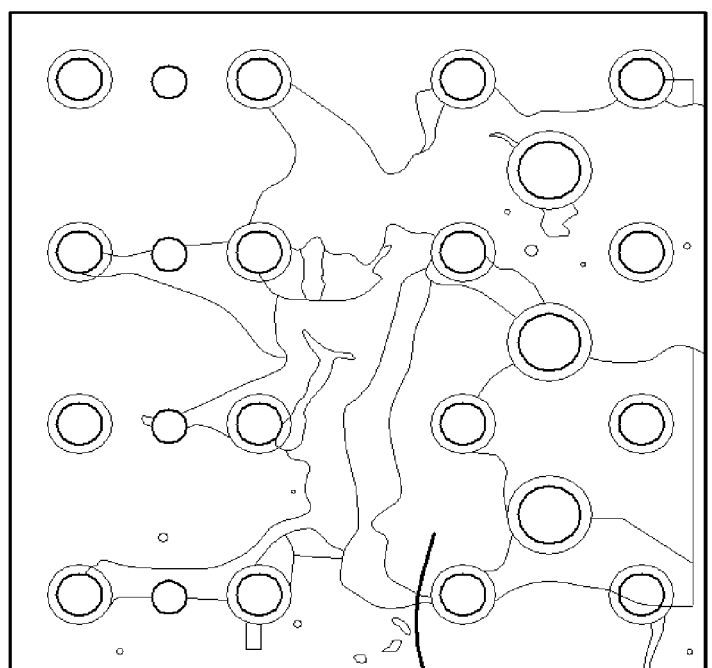
FIG. 7 is a planar photograph of a light emitting device package according to a comparative embodiment.

FIG. 7 is a planar photograph of a light emitting device package according to a comparative embodiment. In the case of the light emitting device package according to the comparative embodiment, the first insulation layers 152, 154 and 156 illustrated in the light emitting device packages 100A and 100B according to the embodiments illustrated in FIGS. 1, 2, 4 and 5 are replaced with a single layer. As such, in the case of the light emitting device package according to the comparative embodiment, the first insulation layer in the form of a single layer may be destroyed by residual stress after a flip-chip bonding process. The destruction of the first insulation layer 152, 154, or 156 may cause the second conductive semiconductor layer 176 to be exposed as illustrated in FIG. 7.

The reason why the first insulation layer in the form of a single layer may be destroyed is that, referring to FIGS. 1 and 2, each of the first insulation layers 152, 154 and 156 has a low coefficient of thermal expansion, whereas the second contact layer 164 and the second pad 144 disposed above and under the first insulation layers 152, 154 and 156, respectively, have high coefficients of thermal expansion. This is because the coefficient of thermal expansion of the second contact layer 164 and the second pad 144, which are formed of a metal such as gold (Au), generally has a relatively high value of $14.16 \times 10^{-6}$/K, whereas the first insulation layers 152, 154 and 156, which have the form of a single layer formed of an insulation material such as $SiO_2$, have a relatively low coefficient of thermal expansion, for example, $0.5 \times 10^{-6}$/K.

In consideration of the above description, since each of the first insulation layers 152, 154 and 156 of the light emitting device packages 100A and 100B according to the embodiments has a multilayer structure including at least two layers, each of the first insulation layers 152, 154 and 156 may have a higher coefficient of thermal expansion than the insulation layer having a single layer structure according to the comparative embodiment, and thus unable to be destroyed due to residual stress after a flip-chip bonding process. The more the number of layers included in the multilayered first insulation layers 152, 154 and 156 increases, the more the first average value of the coefficients of thermal expansion of the first insulation layers 152, 154 and 156 may increase. Accordingly, the light emitting device packages 100A and 100B may achieve enhanced reliability.

In addition, as described previously, when the first insulation layer 152, 154, and 156 includes a DBR, the reflectance in a region at which the second contact layer 164 is not present may be enhanced by the DBR because the DBR can reflect light.

When the above-described second contact layer 164 illustrated in FIG. 3 includes the transparent electrode 164-1 formed of ITO and the reflective layer 164-2 is formed of silver (Ag), the silver (Ag) has good reflectance but poor adhesion. In this case, when the light emitting device K is bonded to the package body 110, peeling of the metal (e.g., silver (Ag)) may occur at the interface between the ITO 164-1 and the reflective layer 164-2 illustrated in FIG. 3 due to the difference in coefficients of thermal expansion. Therefore, according to the embodiment, the first insulation layers 150, 152, 154 and 156 may be manufactured using, for example, Plasma Enhanced Chemical Vapor Deposition (PECVD) so as to enable the capping of the second contact layer 164, thereby improving the adhesion of silver so that the metal may be prevented from peeling.

The case where the first insulation layers 150, 152, 154 and 156 are manufactured using Ion Assisted Deposition (IAD), the high density characteristics of the IAD thin layer may prevent the migration of silver (Ag) from the reflective layer 164-2 and improve the adhesion at the interface between the light emitting structure 170 and the first insulation layers 152, 154 and 156.

The case where the first insulation layers 150, 152, 154 and 156 have a multilayer structure, as exemplarily illustrated in FIG. 3, even if a crack is generated at a stepped corner portion of the second contact layer 164, the first insulation layers 150; 152, 154 and 156 have a multilayer structure, thereby effectively preventing negative effects due to the crack.

Referring again to FIGS. 2 and 4, the molding member 190 of the light emitting device packages 100A and 100B may enclose and protect the light emitting device K. The molding member 190 may be formed of, for example, silicon (Si) and contain phosphors, thus being capable of changing the wavelength of light emitted from the light emitting device K. Although the phosphors may include phosphors selected from among YAG-based, TAG-based, silicate-based, sulfide-based, and nitride-based wavelength change materials which may change light generated from the light emitting device K into white light, the embodiment is not limited to these kinds of phosphors.

The YGA-based and TAG-based phosphors may be selected from among (Y, Tb, Lu, Sc, La, Gd, Sm)3(Al, Ga, In, Si, Fe)5(O, S)12:Ce, and the silicate-based phosphors may be selected from among (Sr, Ba, Ca, Mg)2SiO4:(Eu, F, Cl).

The sulfide-based phosphors may be selected from among (Ca, Sr)S:Eu, (Sr, Ca, Ba)(Al, Ga)2S4:Eu, and the nitride-based phosphors may be selected from among (Sr, Ca, Si, Al, O)N:Eu (e.g., CaAlSiN4:Eu β-SiAlON:Eu) or Ca-α SiAlON:Eu-based (Cax, My)(Si, Al)12(O, N)16 (here, M is at least one of Eu, Tb, Yb, or Er, 0.05<(x+y)<0.3, 0.02<x<0.27, and 0.03<y<0.3).

Red phosphors may be nitride-based phosphors including N (e.g., CaAlSiN3:Eu). The nitride-based red phosphors have higher reliability compared to sulfide-based phosphors in resistance to external environments risks, e.g., heat and moisture and lower discoloration.

Although the light emitting device packages 100A and 100B according to the above-described embodiments illustrated in FIGS. 1 to 6 have a flip-chip bonding structure, the embodiment is not limited thereto. In another embodiment, the present disclosure may also be applied to a light emitting device package having a vertical bonding structure.

According to the embodiment, an array of a plurality of light emitting device packages may be disposed on a board, and optical members, e.g., a light guide plate, a prism sheet, and a diffuser sheet, may be disposed in an optical path of the light emitting device packages. The light emitting device packages, the board, and the optical members may function as a backlight unit.

In addition, the light emitting device package according to the embodiment may be included in a light emitting apparatus, e.g., a display apparatus, an indicator apparatus, and a lighting apparatus.

The display apparatus may include a bottom cover, a reflective plate disposed on the bottom cover, a light emitting module configured to emit light, a light guide plate disposed in front of the reflective plate to forwardly guide light emitted from the light emitting module, optical sheets including prism sheets disposed in front of the light guide plate, a display panel disposed in front of the optical sheets, an image signal output circuit connected to the display panel to supply an image signal to the display panel, and a color filter disposed in front of the display panel. The bottom cover, the reflective plate, the light emitting module, the light guide plate, and the optical sheets may constitute a backlight unit.

The lighting apparatus may include a light source module which includes a board and the light emitting device package according to the embodiment, a radiator configured to radiate heat of the light source module, and a power supply unit configured to process or convert an electrical signal from an external source so as to supply the same to the light source module. For example, the lighting apparatus may include a lamp, a headlamp, or a streetlight.

The headlamp may include a light emitting module which includes the light emitting device packages arranged on a board, a reflector configured to reflect light, emitted from the light source module in a given direction, e.g., a lens configured to forwardly refract light reflected by the reflector, and a shade configured to achieve a light distribution pattern selected by a designer by blocking or reflecting some of light reflected by the reflector and directed to the lens.

According to the embodiments, a light emitting device package may be capable of preventing a first insulation layer from being destroyed by residual stress after flip chip bonding by reducing the difference in coefficients of thermal expansion between a substrate and the first insulation layer.

In addition, the light emitting device may be capable of preventing the peeling of metal at the interface between a reflective layer and a transparent electrode included in a second contact layer and preventing the migration of metal included in the reflective layer. The light emitting device may also be capable of increasing the adhesion between a light emitting structure and the first insulation layer and, thanks to the reflective layer included in the second contact layer, increasing reflectance in a region in which the reflection of light would otherwise be impossible. Additionally, the light emitting device may be capable of effectively preventing negative effects even if a crack is generated at a stepped corner portion of the second contact layer.

Embodiments provide a light emitting device package, which may achieve enhanced adhesion, may prevent the destruction of respective layers due to stress caused by the difference between the coefficients of thermal expansion of the different layers, and may have increased reflectance and improved reliability, and a light emitting apparatus including the package.

In one embodiment, a light emitting device package may include a substrate, a light emitting structure disposed under the substrate, the light emitting structure including a first conductive semiconductor layer, an active layer, and a second conductive semiconductor layer, a first electrode configured to penetrate the second conductive semiconductor layer and the active layer, so as to come into contact with the first conductive semiconductor layer, a contact layer configured to come into contact with the second conductive semiconductor layer, a first insulation layer disposed between the second conductive semiconductor layer and the first electrode and between the active layer and the first electrode, the first insulation layer being provided for capping of a side portion and an upper portion of the contact layer, and a second electrode configured to penetrate the first insulation layer, so as to come into contact with the contact layer.

The contact layer may comprise a reflective material. The contact layer may include a reflective layer, and a transparent electrode disposed between the reflective layer and the second conductive semiconductor layer. The reflective layer may comprise silver (Ag).

The first electrode may include a metal layer configured to penetrate the second conductive semiconductor layer and the active layer, so as to come into contact with the first conductive semiconductor layer, and a bonding pad configured to come into contact with the metal layer. The light emitting device package may further include a second insulation layer disposed to enclose the first insulation layer and the metal layer, and the second electrode may penetrate the first and second insulation layers and the metal layer, so as to come into contact with the contact layer.

The first insulation layer may include at least two layers. The first insulation layer may have a multilayer structure including the at least two layers repeatedly disposed. The at least two layers may be formed of materials having different coefficients of thermal expansion. Each of the at least two layers may comprise at least one of $SiO_2$, $TiO_2$, $ZrO_2$, $Si_3N_4$, $Al_2O_3$, and $MgF_2$.

There may be a difference between a first coefficient of thermal expansion of the substrate and an average value of coefficients of volumetric thermal expansion of the at least two layers of $\pm 3 \times 10^{-6}$K or more. There may also be, a difference between a first coefficient of thermal expansion of the substrate and an average value of coefficients of volumetric thermal expansion of the at least two layers of $\pm 4 \times 10^{-6}$K or less.

Alternatively, the substrate may comprise sapphire, and a difference between a first coefficient of thermal expansion of the substrate and an average value of coefficients of volumetric thermal expansion of the at least two layers may be within a range from $\pm 2.5 \times 10^{-6}$K to $\pm 12.5 \times 10^{-6}$K. For example, the substrate may comprise sapphire, and a difference between a first coefficient of thermal expansion of the substrate and an average value of coefficients of volumetric thermal expansion of the at least two layers may be $\pm 5 \times 10^{-6}$K or less.

There may be a difference between an average value of coefficients of volumetric thermal expansion of the substrate and the light emitting structure and an average value of coefficients of volumetric thermal expansion of the at least two layers within a range from $\pm 3 \times 10^{-6}$K to $\pm 4 \times 10^{-6}$K. The at least two layers may have different thicknesses.

The first insulation layer may include a distributed bragg reflector. The first insulation layer may have a thickness within a range from 0.5 μm to 10 μm.

The light emitting device package may further include first and second lead frames electrically isolated from each other, a first solder disposed between the first electrode and the first lead frame, and a second solder disposed between the second electrode and the second lead frame.

The relative terms "first", "second", "upper", "lower" and the like in the description and in the claims may be used to distinguish between any one substance or element and other substances or elements and not necessarily for describing any physical or logical relationship between the substances or elements or a particular order.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package, comprising:
   a substrate;
   a light emitting structure provided under the substrate, the light emitting structure including a first conductive semiconductor layer, an active layer, and a second conductive semiconductor layer;
   a first electrode configured to penetrate the second conductive semiconductor layer and the active layer to contact the first conductive semiconductor layer;
   a contact layer configured to contact the second conductive semiconductor layer;
   a first insulation layer disposed between the second conductive semiconductor layer and the first electrode and between the active layer and the first electrode, the first insulation layer covering a side portion and an upper portion of the contact layer; and
   a second electrode configured to penetrate the first insulation layer to contact the contact layer,
   wherein the first insulation layer includes at least two layers, which are repeatedly formed to form a multilayer structure, and
   wherein the at least two layers are formed of materials having different coefficients of thermal expansion.

2. The package according to claim 1, wherein the contact layer comprises a reflective material.

3. The package according to claim 2, wherein the contact layer includes:
   a reflective layer; and
   a transparent electrode disposed between the reflective layer and the second conductive semiconductor layer.

4. The package according to claim 3, wherein the reflective layer comprises silver (Ag).

5. The package according to claim 1, wherein the first electrode includes:
   a metal layer configured to penetrate the second conductive semiconductor layer and the active layer to contact the first conductive semiconductor layer; and
   a bonding pad configured to contact the metal layer.

6. The package according to claim 5, further comprising a second insulation layer enclosing the first insulation layer and the metal layer,
   wherein the second electrode penetrates the first and second insulation layers and the metal layer to contact the contact layer.

7. The package according to claim 1, wherein each of the at least two layers comprises at least one of $SiO_2$, $TiO_2$, $ZrO_2$, $Si_3N_4$, $Al_2O_3$, or $MgF_2$.

8. The package according to claim 1, wherein a difference between a first coefficient of thermal expansion of the substrate and an average value of coefficients of volumetric thermal expansion of the at least two layers is $\pm 3 \times 10^{-6}$K or more.

9. The package according to claim 1, wherein a difference between a first coefficient of thermal expansion of the substrate and an average value of coefficients of volumetric thermal expansion of the at least layers is $\pm 4 \times 10^{-6}$K or less.

10. The package according to claim 1, wherein the substrate comprises sapphire, and a difference between a first coefficient of thermal expansion of the substrate and an average value of coefficients of volumetric thermal expansion of the at least two layers is within a range from $\pm 2.5 \times 10^{-6}$K to $\pm 12.5 \times 10^{-6}$K.

11. The package according to claim 10, wherein the substrate comprises sapphire, and a difference between a first coefficient of thermal expansion of the substrate and an average value of coefficients of volumetric thermal expansion of the at least layers is $\pm 5 \times 10^{-6}$K or less.

12. The package according to claim 1, wherein a difference between an average value of coefficients of volumetric thermal expansion of the substrate and the light emitting structure and an average value of coefficients of volumetric thermal expansion of the at least two layers is within a range from $\pm 3 \times 10^{-6}$K to $\pm 4 \times 10^{-6}$K.

13. The package according to claim 1, wherein the at least two layers have different thicknesses.

14. The package according to claim 3, wherein the first insulation layer includes a distributed bragg reflector.

15. The package according to claim 1, further comprising:
first and second lead frames electrically isolated from each other;
a first solder disposed between the first electrode and the first lead frame; and
a second solder disposed between the second electrode and the second lead frame.

16. The package according to claim 1, wherein the first insulation layer has a thickness within a range from 0.5 μm to 10 μm.

17. A light emitting apparatus comprising the light emitting device package according to claim 1.

* * * * *